(12) United States Patent
Funato et al.

(10) Patent No.: US 8,089,291 B2
(45) Date of Patent: Jan. 3, 2012

(54) ELECTROMAGNETIC WAVE GENERATION SOURCE SEARCHING METHOD AND CURRENT PROBE USED THEREFOR

(75) Inventors: Hiroki Funato, Yokohama (JP); Takashi Suga, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/817,328

(22) Filed: Jun. 17, 2010

(65) Prior Publication Data

US 2010/0253367 A1 Oct. 7, 2010

Related U.S. Application Data

(63) Continuation of application No. 11/502,435, filed on Aug. 11, 2006, now Pat. No. 7,772,856.

(30) Foreign Application Priority Data

Sep. 20, 2005 (JP) ................................ 2005-271318

(51) Int. Cl.
*G01R 19/00* (2006.01)
(52) U.S. Cl. ...................... 324/713; 324/117 R; 336/225
(58) Field of Classification Search .............. 324/117 R, 324/713, 529; 336/225
See application file for complete search history.

(56) References Cited

U.S. PATENT DOCUMENTS

| | | | |
|---|---|---|---|
| 5,852,395 A | 12/1998 | Bosco | |
| 6,121,779 A | 9/2000 | Schutten et al. | |
| 6,147,482 A | 11/2000 | Kubodera | |
| 6,624,624 B1 | 9/2003 | Karrer et al. | |
| 7,106,162 B2 | 9/2006 | Saito | |
| 2003/0137388 A1* | 7/2003 | Meier et al. | 336/225 |

FOREIGN PATENT DOCUMENTS

| | | |
|---|---|---|
| JP | 10-163665 | 6/1998 |
| JP | 11-14680 | 1/1999 |
| JP | 11-166957 | 6/1999 |
| JP | 2000-009775 | 1/2000 |
| JP | 2001-228227 | 8/2001 |
| JP | 2002-156430 | 5/2002 |
| JP | 2003-142869 | 5/2003 |
| JP | 2003-279611 | 10/2003 |

OTHER PUBLICATIONS

Japanese Office Action issued in Japanese Patent Application No. 2005-271318 on Mar. 16, 2010.
Nobuyuki Ikeda, "A Study on Junction-Current Between PCB and Chassis", The Institute of Electronic Information Communication, Sep. 7, 2005.
U.S. Appl. No. 11/502,435, filed Aug. 11, 2006, Hiroki Funato et al., Hitachi, Ltd.
Japanese Office Action, dated Mar. 1, 2011, issued in corresponding Japanese Patent Application No. 2005-271318.

* cited by examiner

*Primary Examiner* — Vincent Q Nguyen
(74) *Attorney, Agent, or Firm* — Antonelli, Terry, Stout & Kraus, LLP.

(57) ABSTRACT

A junction-current probe is provided which can measure a current flowing in a junction port adapted to connect a circuit board or an electronic apparatus to a chassis under the condition that the circuit board or electronic apparatus is packaged to the chassis. Structurally, the current probe has a circular or rectangular insulator having a hole in the center, a coiled conductor wire for converting linkage flux into voltage, an insulating member for preventing the insulator from making electrical contact with surroundings, an extraction lead for connecting opposite ends of the conductor wire to a cable and the cable for connection to a measurement unit. The current probe is reduced in thickness within in a range in which the condition of packaging to the chassis can remain unchanged.

4 Claims, 14 Drawing Sheets

ELECTROMAGNETIC WAVE GENERATION SOURCE SEARCHING METHOD AND CURRENT PROBE USED THEREFOR

CLAIM OF PRIORITY

This application is a continuation of application Ser. No. 11/502,435, filed on Aug. 11, 2006 now U.S. Pat. No. 7,772,856, now allowed, which claims the benefit of Japanese Application No. JP 2005-271318 filed on Sep. 20, 2005, in the Japanese Patent Office, the disclosures of which are incorporated herein by reference.

BACKGROUND OF THE INVENTION

The present invention relates to a probe for measurement of the intensity/phase of a current flowing through a junction port between electronic apparatuses or between an electronic apparatus and a circuit board.

In an electronic apparatus or the like, in order to specify or identify the position of a current responsible for unwanted electromagnetic wave radiation or the path of a mutual electromagnetic interference between electronic apparatuses or between electronic circuits which gives the cause of erroneous operation/degradation in performance, a technique of measuring the magnetic field distribution in the vicinity of the electronic apparatus is efficient.

The present inventors have hitherto made public a magnetic field probe or measuring method and apparatus as described in, for example, JP-A-2002-156430 and JP-A-2003-279611. Of these references, the former pertains to the magnetic field probe and the latter is concerned with the measuring method and apparatus.

In general, with a view to identifying a radiation location or site of an unwanted electromagnetic wave the unity of a circuit board radiates, a position of a current responsible for radiation can be identified by measuring the magnetic field distribution above and nearby the circuit board.

And also, with the aim of identifying a radiation site of an unwanted electromagnetic wave a chassis of electronic apparatus radiates, a study can be made in a way similar to the case of the unity of a board by measuring the magnetic field distribution in the vicinity of the chassis.

SUMMARY OF THE INVENTION

Generally, the position of a radiation source of an unwanted electromagnetic wave the unity of a board radiates can be identified using a loop antenna for measurement of nearby magnetic fields. In this case, an LSI or an element such as a quartz oscillator is used as an excitation source and a signal, a ground (GND) pattern or the like operates as an antenna for radiating the unwanted wave, so that a counterplot for reduction of unwanted electromagnetic wave radiation is fulfilled by changing the layout of a circuit board (PCB; Printed Circuit Board) or by making circuit alterations and the unity of board is applied with a counterplan against EMI (Electro Magnetic Interference).

But, even when the EMI counterplan applied to the board unity is fulfilled completely, the level of an unwanted electromagnetic radiation changes at the time the board is packaged or mounted to a chassis or frame for housing the board, giving rise to a problem that an unwanted electromagnetic wave is newly generated in the whole of the chassis. The reason for this problem is that the board as a whole acts as an excitation source and the chassis functions as an antenna. Available as a method for measuring an electromagnetic wave the whole of the chassis radiates is an expedient of remote field measurement. With this method, however, a site or location giving the cause cannot be identified and therefore, for improving the situation, a process is reiteratively executed in which the board is once dismounted and is applied with the EMI counterplan by again measuring a nearby field and thereafter, the board is remounted to the chassis and a remote electromagnetic field of the whole of the chassis is remeasured. But, the result of measurement of a nearby magnetic field above the board cannot often be correlated with a remote magnetic field at the time that the board is mounted to the chassis and the aforementioned counterplot is often time-consuming. Even if the EMI counterplot is desired to be applied to the chassis, the chassis often has a three-dimensionally complicated shape in general, making it difficult to perform the current distribution measurement, and disadvantageously, prolonged time and high costs result.

The present invention intends to solve the problems as above and provide a measurement method for more speedily performing an EMI counterplot applied to a chassis connected with either a circuit board or an electronic apparatus packaging the circuit board and a method for searching an electromagnetic wave generation source at the chassis level. Further, the present invention provides a probe for realizing the methods as above.

The present inventors have noticed that a common mode current predominantly responsible for a remote electromagnetic field radiated by a chassis packaging a board flows out of the board through a cable or the like connected to the board but a return current of the common mode current returns to GND of the board and therefore will flow to a junction port between the board and the chassis without fail. The inventors have also noticed that in the case of the chassis packaging the board, the board functions as an excitation source and the chassis functions as an antenna and hence a current responsible for an electromagnetic filed in the remote the chassis mounting the board radiates will flow through a junction port between the excitation source and the antenna without fail, thereby succeeding in finding that by measuring junction-currents in individual junction ports between the board and the chassis to identify a path through which a current responsible for a remote field flows, an effective counterplot against an unwanted electromagnetic wave from the whole of the chassis can be made.

Then, typical ones of inventions disclosed in the present application will be outlined as below.

(1) A method for searching an electromagnetic wave generation source in a chassis packaging a board, wherein search is made by measuring currents flowing through a plurality of junction members adapted to connect the board and the chassis.

(2) An electromagnetic wave generation source searching method as recited in (1), wherein a current is measured by using a junction member which passes through a hole a circular current probe has.

(3) An electromagnetic wave generation source searching method as recited in (1) or (2), wherein a current is measured while the board and the chassis are connected together by means of a junction member.

(4) An electromagnetic wave generation source searching method as recited in (2), wherein the current probe includes an insulator having a hole and a conductor wire wound on the insulator by a plurality of turns.

(5) An electromagnetic wave generation source searching method as recited in (4), a conductor member is provided at a circumferential edge zone of the hole on one surface of the insulator, a congruent conductor member is provided at a circumferential edge zone of the hole on the other surface of the insulator and these conductor members are electrically connected together by way of a conductor member provided on an inner wall of the hole of the insulator.

(6) A current probe for measuring a current in a junction member adapted to connect a chassis and a board, which comprises a circular insulator having a hole and a conductor wound in a coil on the insulator by a plurality of turns.

(7) A current probe as recited in (6), wherein a conductor member is provided at a circumferential edge zone of the hole on one surface of the insulator, a congruent conductor member is provided at a circumferential edge zone of the hole on the other surface of the insulator, and these conductor members are electrically connected together by way of a conductor member provided on an inner wall of the hole of the insulator.

(8) A current probe for measuring a current in a junction member adapted to connect a chassis and a board, which comprises an insulator having a hole, a conductor wire wound in a coil on the insulator and an insulating film so formed as to cover part of the conductor wire which confronts at least an inner wall of the hole.

(9) A current probe for measuring a current in a junction member adapted to connect a chassis and a board, which includes a circuit board and a coil formed by first wiring patterns provided on first and second surfaces of the circuit board, respectively, and a second wiring pattern electrically connected to the first wiring patterns provided on the first and second surfaces of the circuit board by way of a through-hole.

These and other objects, features and advantages of the invention will be apparent from the following more particular description of preferred embodiments of the invention, as illustrated in the accompanying drawings.

DESCRIPTION OF THE EMBODIMENTS

Measurement apparatus, measurement principle and measurement method of the present invention will now be described by way of example with reference to the accompanying drawings.

Figure 2:
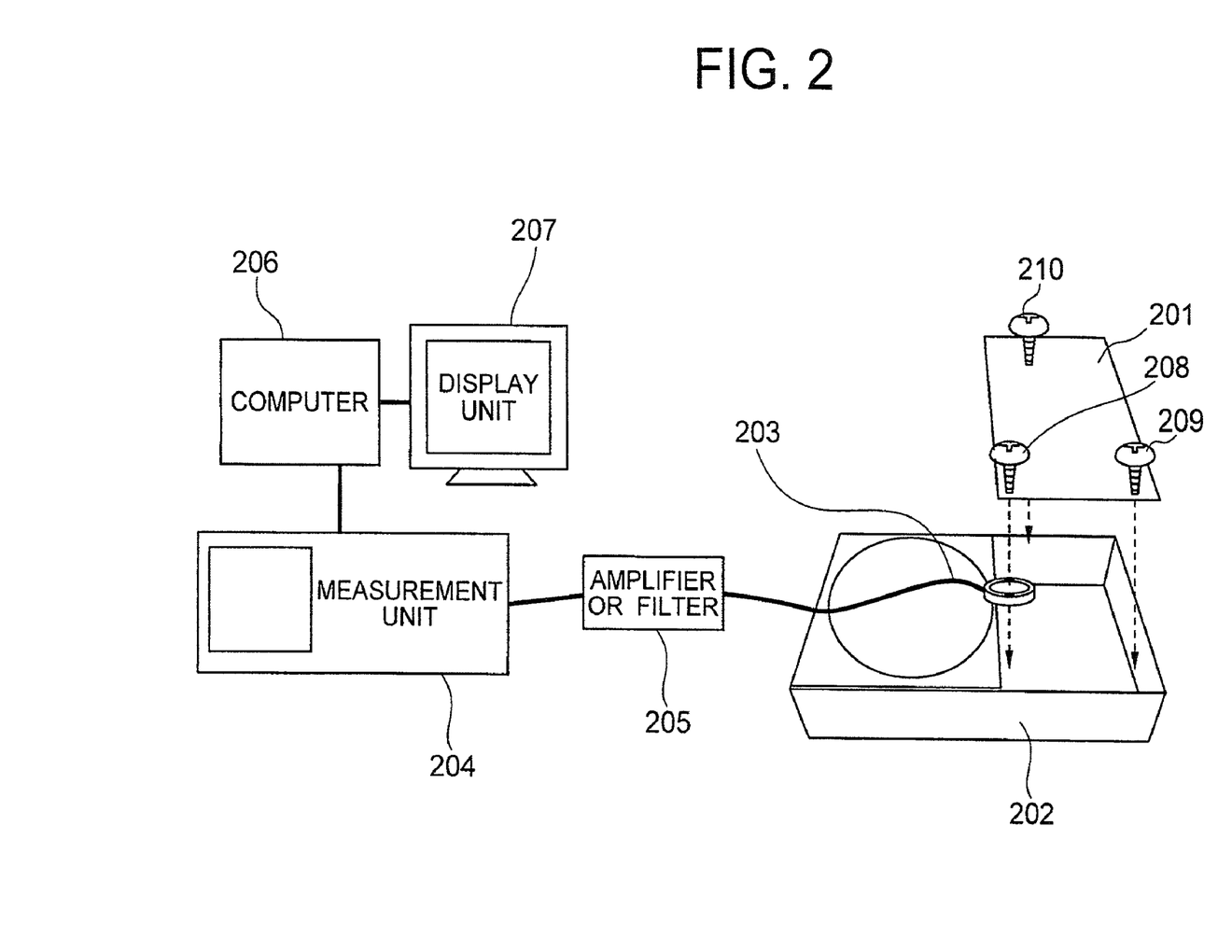
FIG. 2 is a diagram showing a configuration of a measurement apparatus according to the invention.

Referring first to FIG. 2, a measurement apparatus for measuring currents flowing in a junction port between a circuit board 201 and a chassis 202 comprises a current probe 203 adapted to measure a current flowing in the junction port in the form of a screw 208 between circuit board 201 and chassis 202, a measurement unit 204 for measuring a signal from the probe 203, an amplifier or filter 205 for amplifying the signal from current probe 203 to a desired magnitude or for extracting only a frequency component of the signal, a computer 206 including a CPU and memories for calculation of current intensity and phase from measurement results of voltage or power and a storage unit for storing a program necessary for the calculation, and a display unit 207 for displaying the measurement results.

Figure 1:
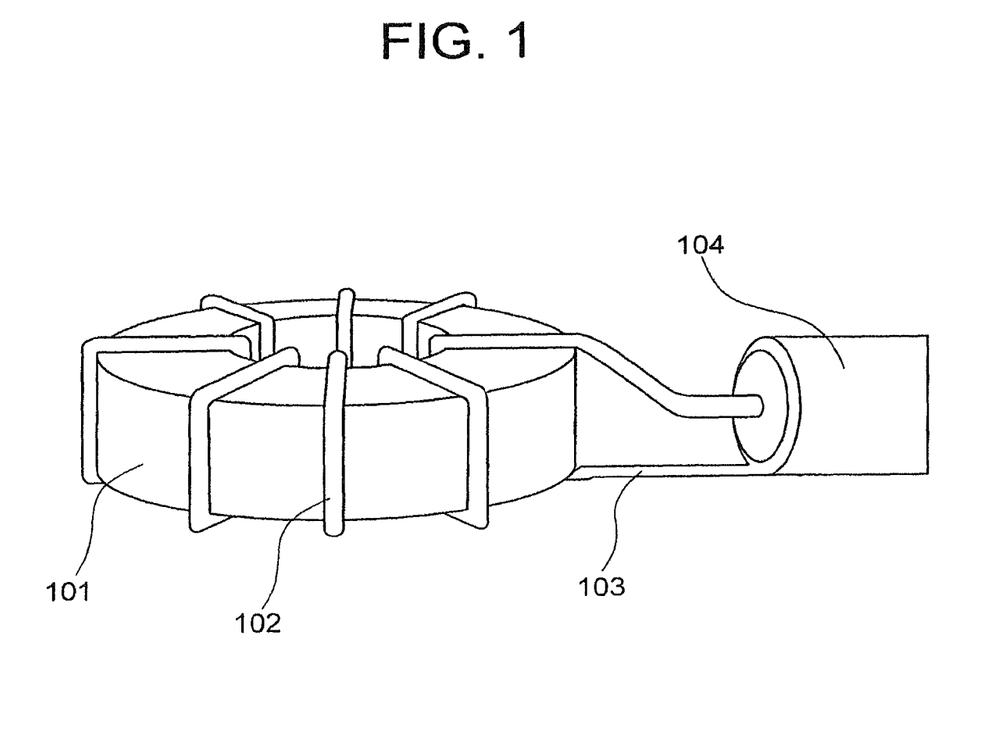
FIG. 1 is a diagram showing a structure of a current probe according to the present invention.

The current probe 203 used herein has a structure including a circular or rectangular insulator having a hole in the center and a coil for current measurement wound on the insulator. More specifically, the current probe 203 is so structured that as shown in FIG. 1, a conductor wire 102 is wound in a coil on a circular or rectangular insulator 101 having a hole in the center and its opposite ends merging into an extraction lead 103 connected to a cable 104 or connector for connection to the measurement unit.

The circuit board or an electronic apparatus is mounted to the chassis by causing a junction member such as the screw 208 to pass through the center hole of the current probe 203 to form an actually operable system so that a current flowing out of the board to the chassis in actual operation may be measured.

More specifically, a voltage induced across the cable connected to the current probe 203 can be converted into a component of desired frequency f or amplified to a desired signal intensity through the filter or amplifier 205, the resulting signal can be fetched into the measurement unit 204, the measured position and measured result can be stored in the storage unit of computer 206, and the stored measurement result of the junction-current can be compared with the result of measurement of an electromagnetic field in the remote. Then, by studying the correlation therebetween, a junction port in which the current responsible for the remote field flows can be identified. It is to be noted that the actual packaging or mount state of the circuit board and chassis should not be changed and therefore the current probe preferably has a very thin structure comparable to a washer (10 mm or less).

The filter 205 may not always be a band-pass filter but may preferably be materialized by using a variable high-pass filter and a variable low-pass filter in combination so that an arbitrary measurement frequency can be set. Further, in order not to disturb the spatial electromagnetic field distribution in the vicinity of a measurement target, the distance must intervene between the current probe 203 and the measurement apparatus comprised of the filter or amplifier 205 to exceed an electromagnetically proximate distance therebetween. The electromagnetically proximate distance signifies a distance r which satisfies $r \leq \lambda/(2\pi)$ between the circuit board 201 or chassis 202 representing a measurement target and the current probe 203.

Figure 3:
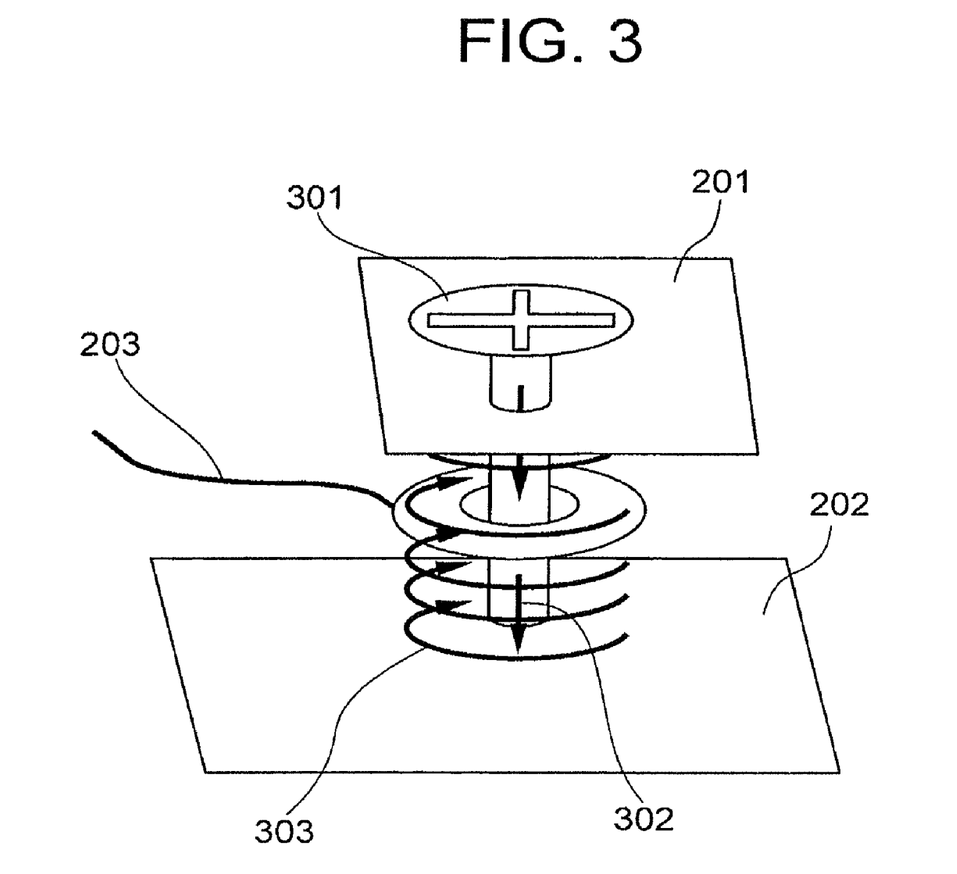
FIG. 3 is a perspective view useful to explain the principle of measurement by the current probe according to the invention.

Next, the principle of measurement by the junction-current probe 203 will be detailed more specifically with reference to FIG. 3.

When a screw 301 is tightened under the condition that the junction-current probe 203 is so arranged as to allow the screw 301 connecting the circuit board 201 and chassis 202 to pass through its center, a current flowing from circuit board 201 to chassis 202 or vice versa passes through the screw 301 representing the junction port. When the current flows in the screw 301, a magnetic field 303 is generated around the screw and this magnetic field interlinks the coiled conductor wire 102 of current probe 203. As a result of the interlinkage of the magnetic field with the coiled conductor wire 102, a voltage is induced across the opposite ends of coiled conductor 102 and the thus induced voltage is measured with the measurement unit 104 and calculated for conversion into a current value, thereby determining a junction-current 302.

Where cross-sectional area of insulator 101 is S, frequency is f, permeability of the coiled conductor wire is $\mu$ magnetic field intensity is H and the number of turns is N, the induced voltage V across the opposite ends of coiled conductor wire 102 measured by measuring the current in the junction port by means of the current probe 203 can be expressed as $V=2 \cdot \pi \cdot f \cdot \mu \cdot S \cdot H \cdot N$. As the number of turns N increases, the induced voltage increases and the sensitivity to the current also increases. But in consideration of the fact that the capacitive coupling among turns of wiring and inductance of the coiled conductor wire 102 per se give rise to a reduction in output voltage at high frequencies, the number of turns may preferably be changed as necessary.

Figure 4:
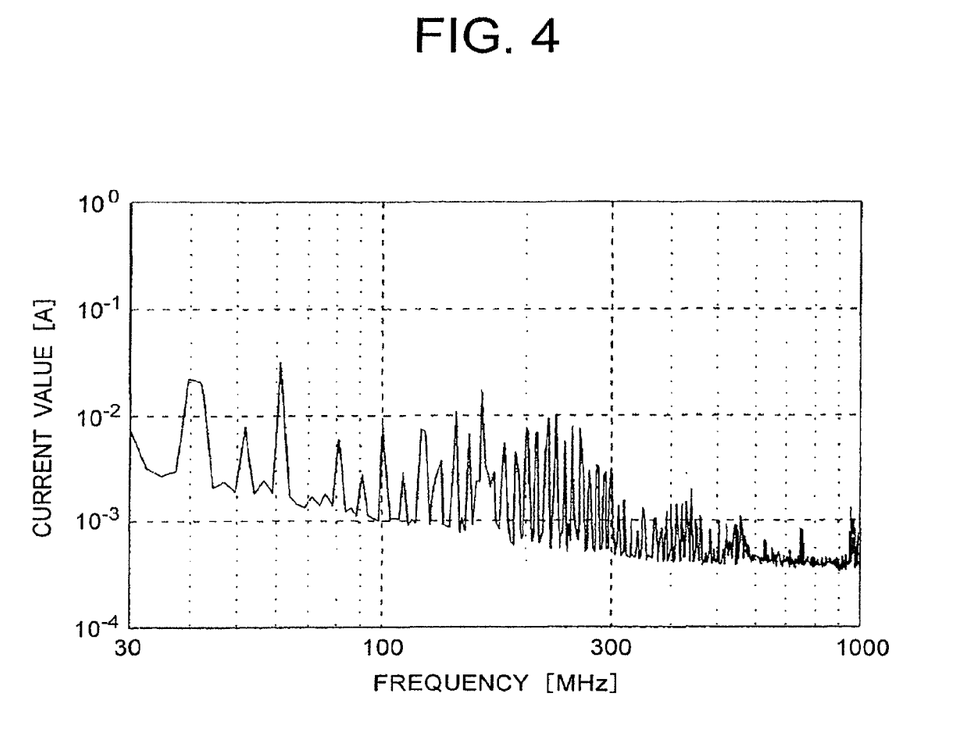
FIG. 4 is a graph showing the result of measurement of a current in a junction port in the form of a screw A obtained in an experiment conducted using the current probe according to the invention.
Figure 5:
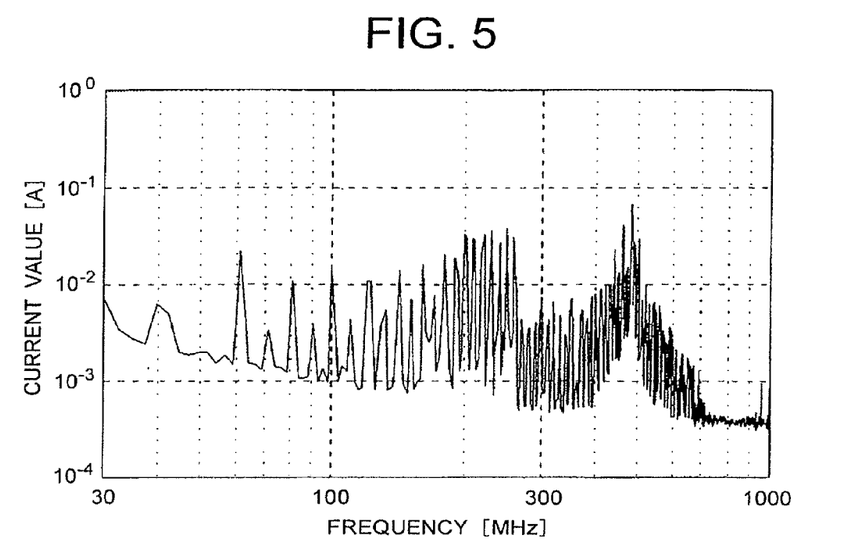
FIG. 5 is a graph showing the result of measurement of a current in a junction port in the form of a screw B obtained in an experiment conducted using the current probe according to the invention.
Figure 6:
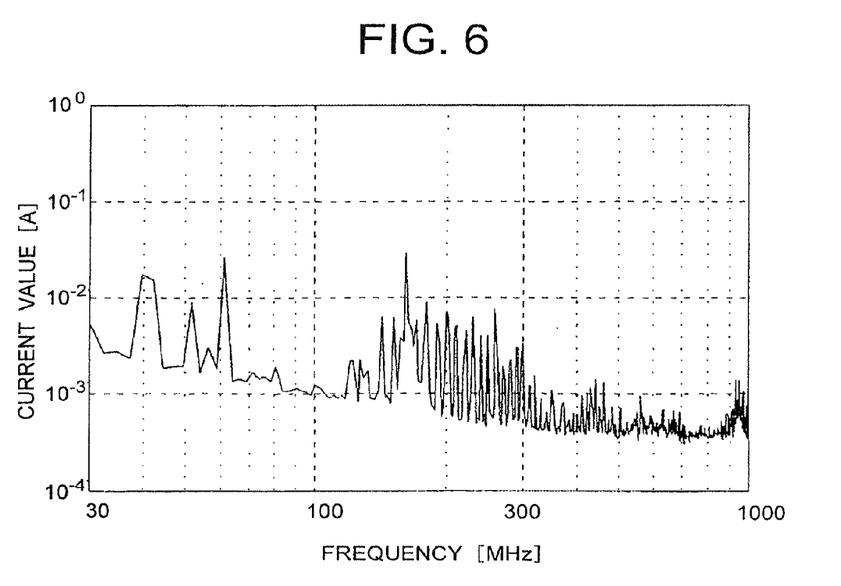
FIG. 6 is a graph showing the result of measurement of a current in a junction port in the form of a screw C obtained in an experiment conducted using the current probe according to the invention.
Figure 16:
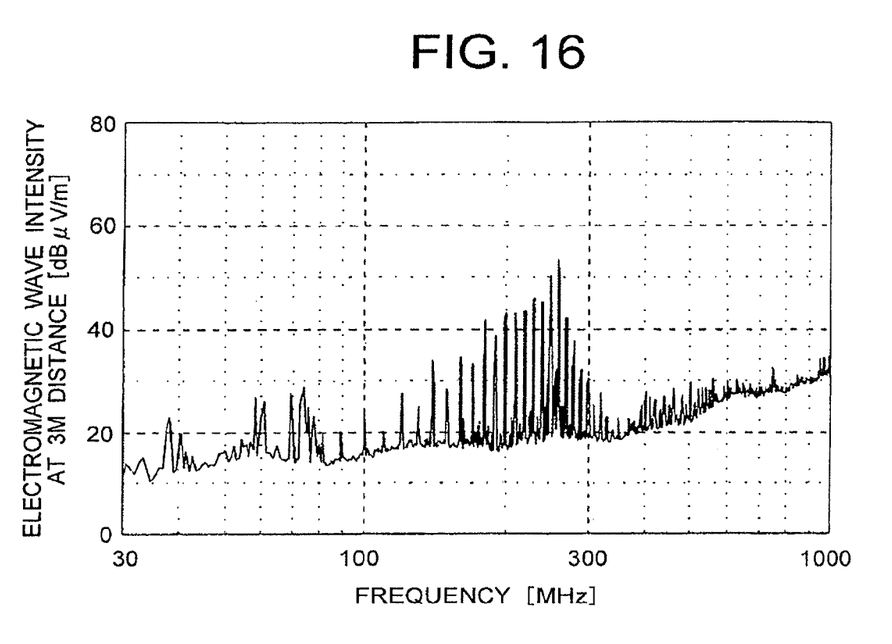
FIG. 16 is a graph showing the result of experimental measurement of intensity of an electromagnetic wave obtained at 3 m distance from a circuit board mounted to the chassis by using only the screw A.

Next, the result of experimental measurement of an actual current in the junction port carried out by using a trial junction port current probe 203 will be described. In the measurement, a pseudo-noise board carrying a pseudo-sound source of quartz oscillator at 8 MHz and a flip-flop IC is used as the circuit board 201, a 3.5-inch hard-disk drive (HDD) is used as the chassis 202 and a screw 301 is used as the junction member. When the screws 301 are applicable to three locations as indicated at screw A 208, screw B 209 and screw C 210 and a junction-current is measured in association with each of these screws, the measurement results are shown in FIGS. 4, 5 and 6, respectively. Meanwhile, the result of measurement of an electromagnetic wave intensity spectrum at 3 m distance when only the screw A 208 is tightened is depicted in FIG. 16, the result of measurement of an electromagnetic wave intensity spectrum at 3 m distance when only the screw B 209 is tightened is depicted in FIG. 17 and the result of measurement of an electromagnetic wave intensity spectrum at 3 m distance when only the screw C 210 is tightened is depicted in FIG. 18.

Figure 7:
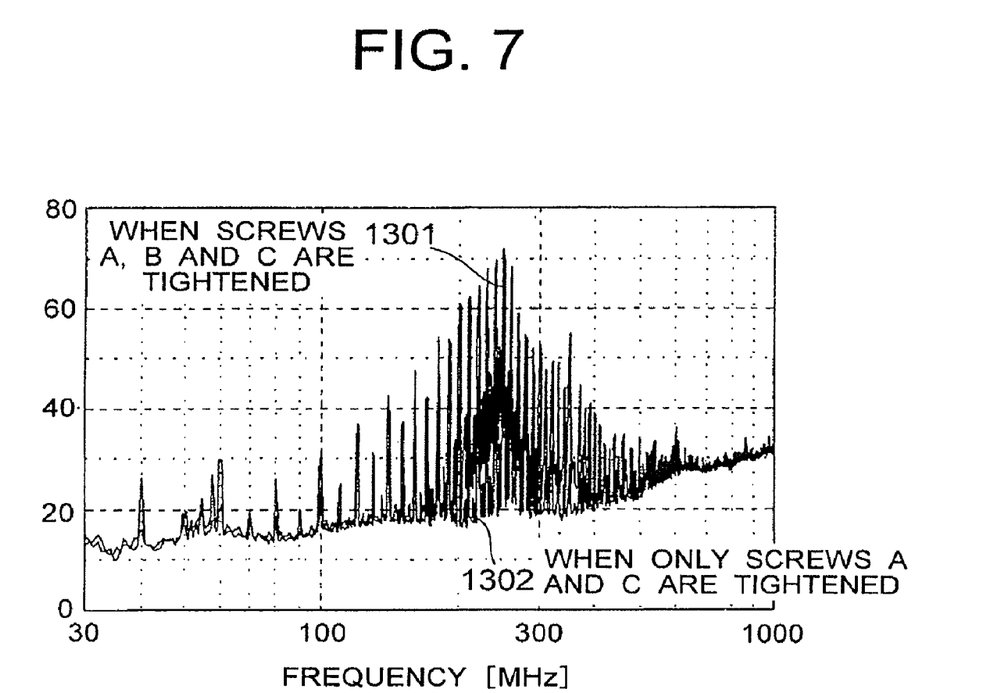
FIG. 7 is a graph showing the result of experimental measurement of intensity of an electromagnetic wave obtained at 3 m distance from a circuit board packaged in a chassis.
Figure 17:
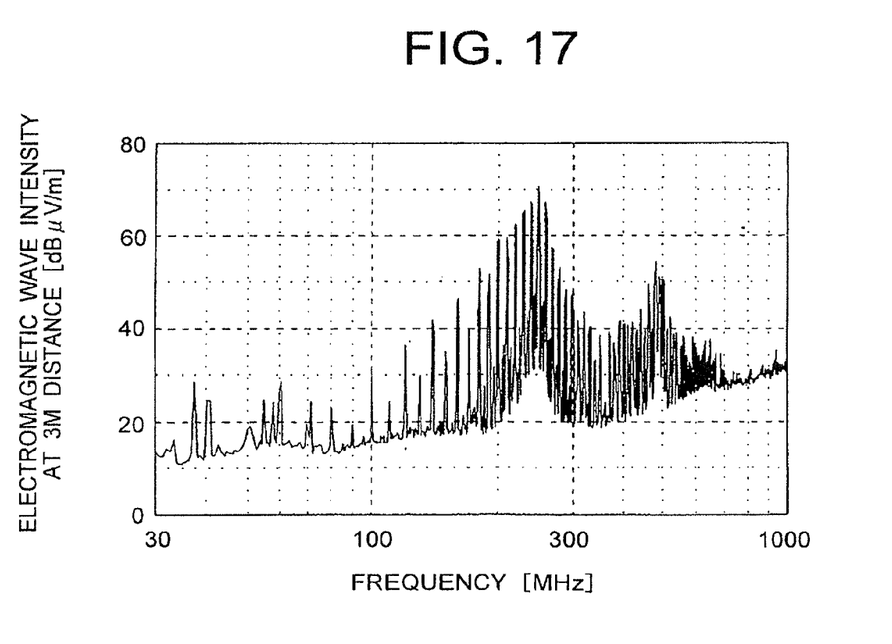
FIG. 17 is a graph showing the result of experimental measurement of intensity of an electromagnetic wave obtained at 3 m distance from the circuit board mounted to the chassis by using only the screw B.
Figure 18:
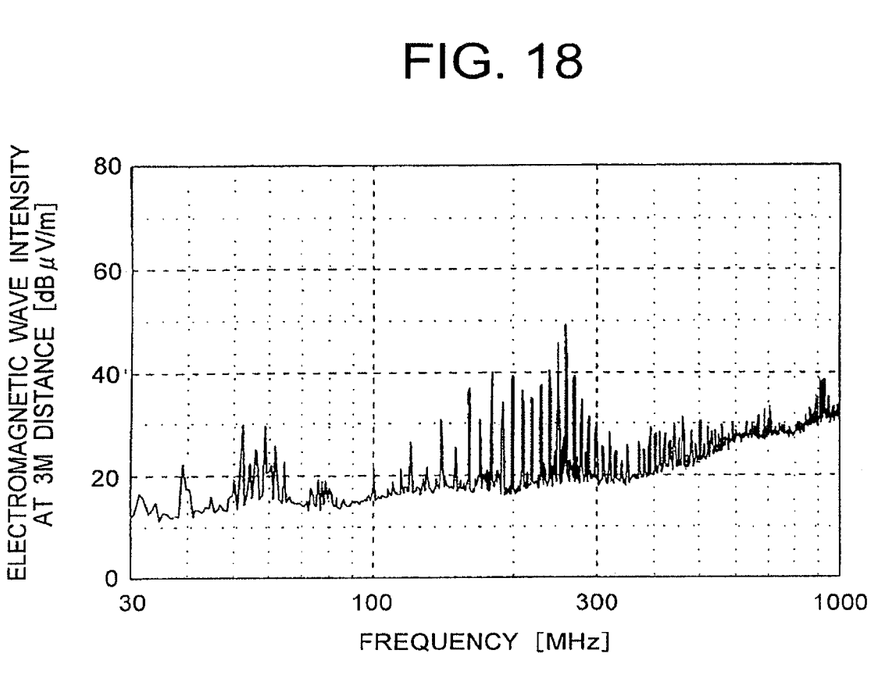
FIG. 18 is a graph showing the result of experimental measurement of intensity of an electromagnetic wave obtained at 3 m distance from the circuit board mounted to the chassis by using only the screw C.

The result of measurement shown in FIG. 5 of current in the junction port represented by the screw B and the electromagnetic wave intensity spectrum at 3 m distance as shown in FIG. 17 when only the screw B is tightened have levels higher than those obtained in association with other screws A and C, demonstrating that the current from the circuit board 201 to the chassis 202 mainly flows through the screw B. Then, only the screw B is dismounted and only the rest of screws A and C is tightened. In this case, the remote spectrum is measured with the pseudo-noise board packaged to the chassis 202, obtaining a resulting remote spectrum 1302 as shown in FIG. 7. As compared to a remote spectrum 1301 obtained when all of the screws A, B and C are tightened, the remote spectrum 1302 will be seen as being reduced in electromagnetic radiation level by about 10%. In this manner, the path through which the current responsible for the remote field flows can be identified and the cause of an unwanted electromagnetic radiation increased when the circuit board 201 is mounted to the chassis 202 can be studied speedily and a counterplot thereagainst can be taken quickly.

Next, embodiments of structure of the current probe used in the present measurement apparatus will be described.

Firstly, the previously-described junction-current probe structure representative of a first embodiment will again be described in greater detail with reference to FIG. 1.

As shown in FIG. 1, the junction-current probe 203 includes the circular or rectangular insulator 101 having a hole in the center, the coiled conductor wire 102 for converting interlinked flux into voltage, the extraction lead 103 for connecting the opposite ends of conductor wire to the cable and the cable 104 used for connection to the measurement unit. The shape of insulator 101 is not limitative and the insulator 101 may take a shape suitable for the junction port provided that the packaging state of circuit board 201 and chassis 202 will not be disturbed. Generally, in many applications, the circuit board 201 is screwed to the chassis 202 and in such an instance, the current probe is preferably shaped congruently with a washer built in originally, so that the current probe 203 can be set up in place of the washer. The central hole is for passage of a junction member and its shape is not limited to a circular or rectangular form but may suitably be changed to either a square form or a polygonal form. To meet the screw 301 representing a general junction member, the circular form is preferable. Further, for the sake of keeping the coiled conductor wire 102 from coming into electrical contact with surrounding conductors, the coiled conductor wire is preferably covered with an insulating material. Furthermore, with a view to preventing the extraction lead 103 from being interfered with a surrounding electromagnetic external disturbance, each extraction lead wire is preferably covered with a conductor shielding electrically connected to GND of the cable 104. Preferably, a coaxial cable is used as the cable 104 but this is not limitative. Preferably, the length of the extraction lead is as short as possible.

Figure 8:
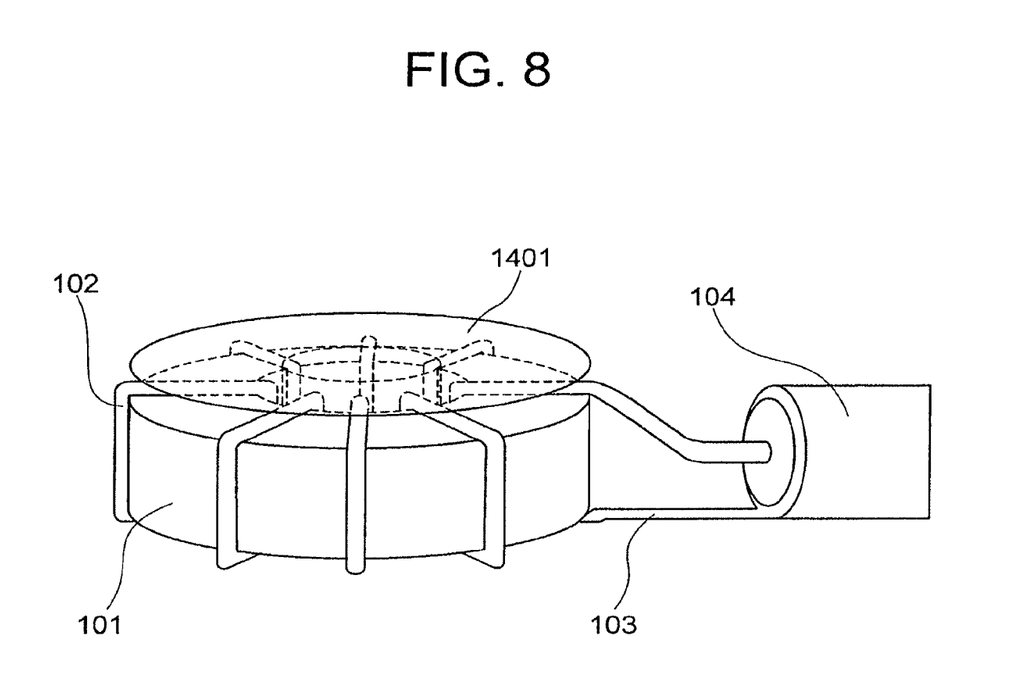
FIG. 8 is a perspective view showing a structure of a second embodiment of the current probe according to the invention.

Next, a second embodiment of the junction port current probe 203 will be described with reference to FIG. 8.

Figure 14:
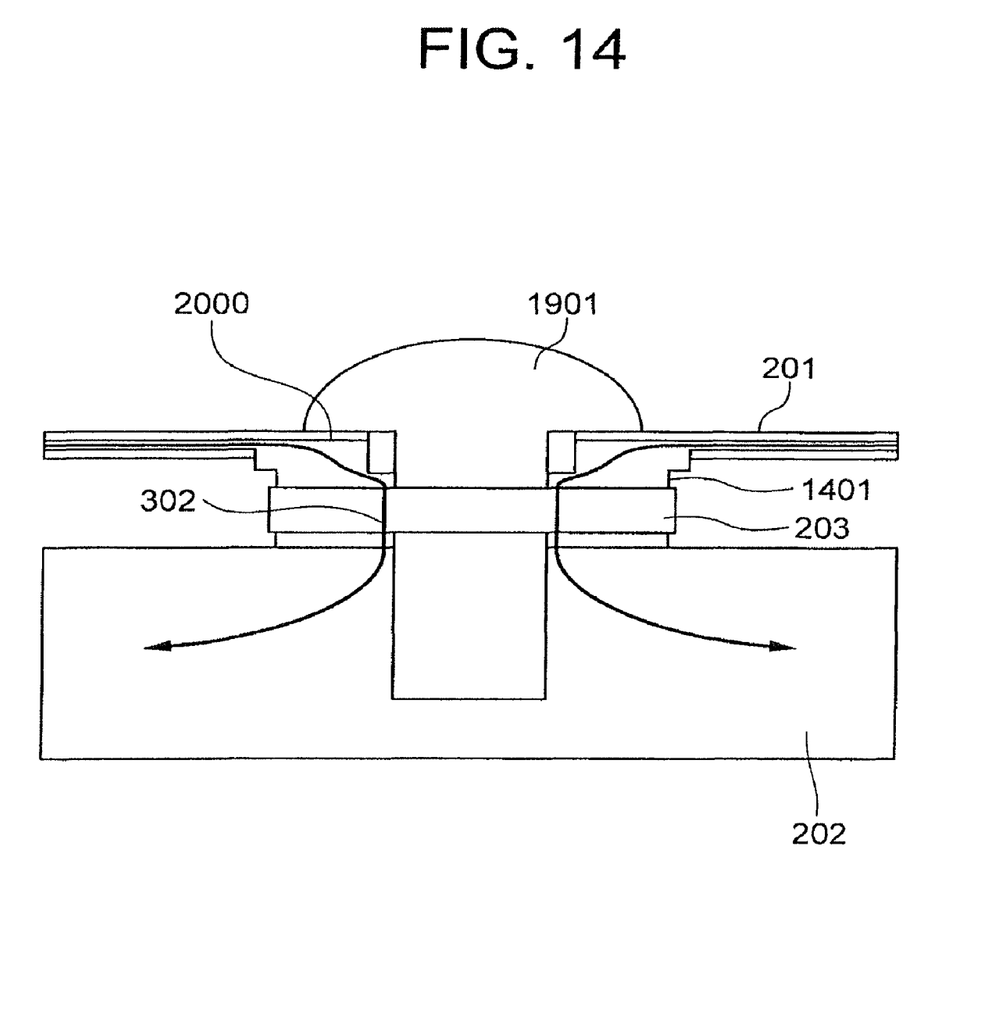
FIG. 14 is a fragmentary sectional view showing a current flowing in a junction port in the case of a junction member being an insulator.

The present embodiment differs from the first embodiment of junction port current probe in that conductor members 1401 are provided at circumferential edge zones on upper and lower surfaces and on an inner wall of the hole, respectively, of the insulator on which a conductor wire is wound in a coil. With this structure, even when conductors of circuit board 201 are brought into physical contact with those of chassis 202 to electrically conduct therewith and the junction member such as a screw is formed of an insulator, the circular conductor members 1401 of the current probe 203 act as a current path as shown in FIG. 14, thus ensuring that a junction-current 302 can be measured.

Figure 13:
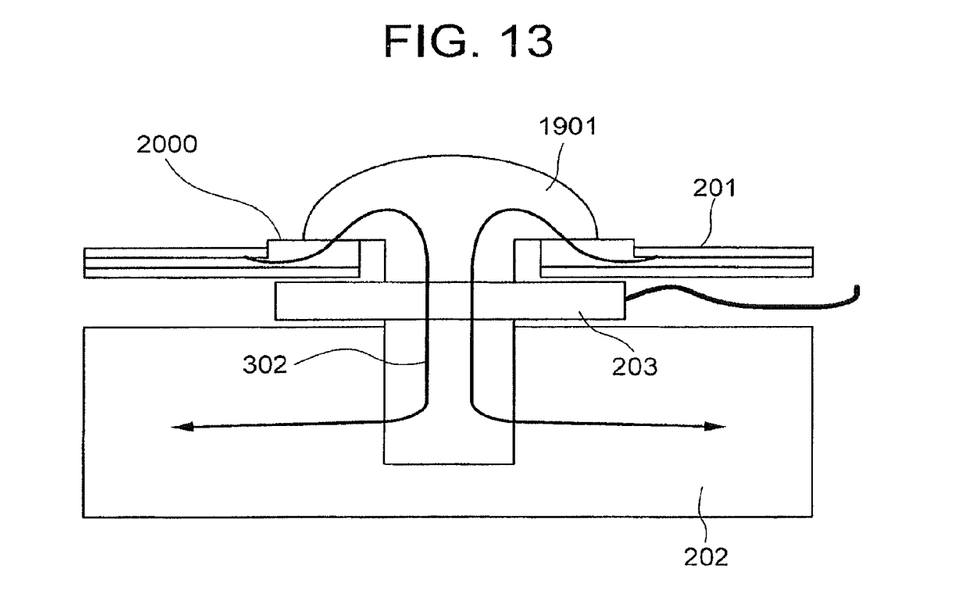
FIG. 13 is a fragmentary sectional view showing a current flowing in a junction port in the case of a junction member being a conductor.

Namely, in the case of the junction-current probe in the first embodiment, a pattern such as GND 2000 on the circuit board 201 electrically conducts, as shown in FIG. 13, to the screw 1901 representing the junction port and the chassis 202 also electrically conducts, in a similar manner, to the screw 1901 representing the junction port, so that the junction member is conditioned to be an electrically conductive member whereas the junction-current probe in the second embodiment is efficient to deal with an electrically insulating junction member.

Figure 9:
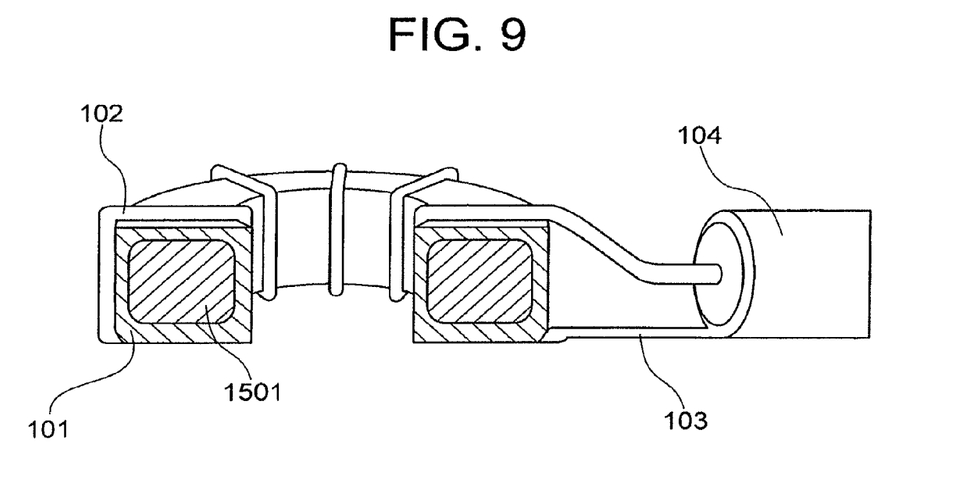
FIG. 9 is a perspective view, partly sectioned, showing a structure of a third embodiment of the current probe according to the invention.

Turning now to FIG. 9, a third embodiment of junction port current probe 203 will be described.

The present embodiment is identical to the first embodiment of junction port current probe with exception that a circular or rectangular insulator 101 is made of a magnetic member 1501 or has it internally thereof. With this structure, magnetic flux can be confined inside a coiled conductor wire 102 to increase induced voltage, thus making it possible to make high the sensitivity to the junction-current 302.

Figure 10:
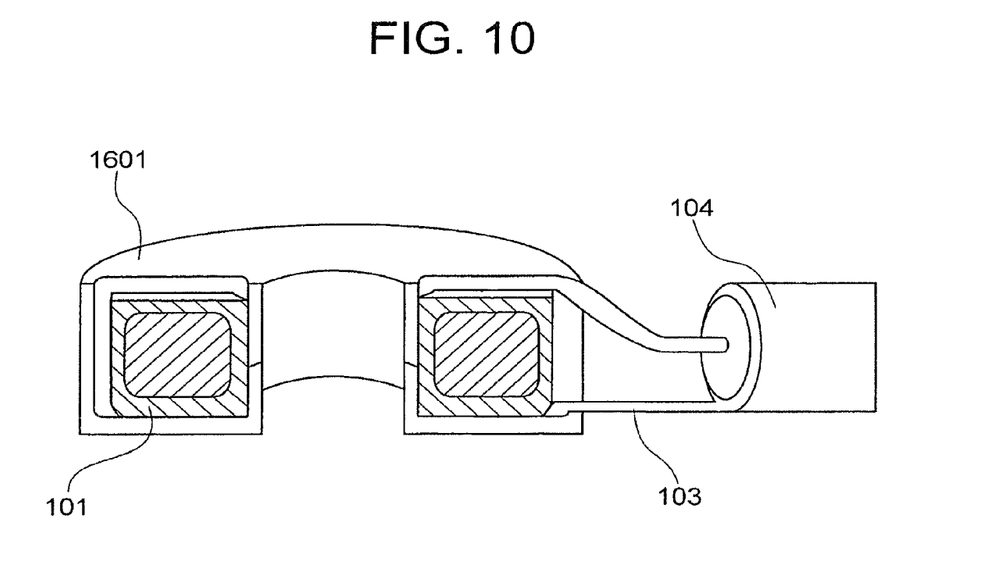
FIG. 10 is a perspective view, partly sectioned, showing a structure of a fourth embodiment of the current probe according to the invention.

Next, a fourth embodiment of junction-current probe 203 will be described by making reference to FIG. 10.

The present embodiment is identical to the first embodiment of junction-current probe with the only exception that the insulator on which the coiled conductor wire 102 is wound is surrounded with a conductor member 1601. With this structure, noise component due to surrounding electromagnetic disturbance hardly interferes and improvements in measurement accuracy can be promoted. Preferably, the coverage of conductor member 1601 is connected to GND of each of the cable and measurement unit and its periphery is covered with an insulator to avoid electrical contact between the conductor member and surroundings.

In the junction-current probes in the foregoing embodiments, with the aim of canceling self-inductance L of the coiled conductor wire 102, an electrical capacitor can be connected in series with the coiled conductor wire. Specifically, incorporation of a chip condenser or the like is conceivable. In addition, midway between the extraction lead 103 and measurement unit 204 or in the measurement unit 204, measured voltage or current may be rectified and detected using a diode or rectifier element and the current/voltage intensity may be measured as DC voltage. The type of the diode and rectifier is not limitative and may be built in the insulator 101.

Figure 11:
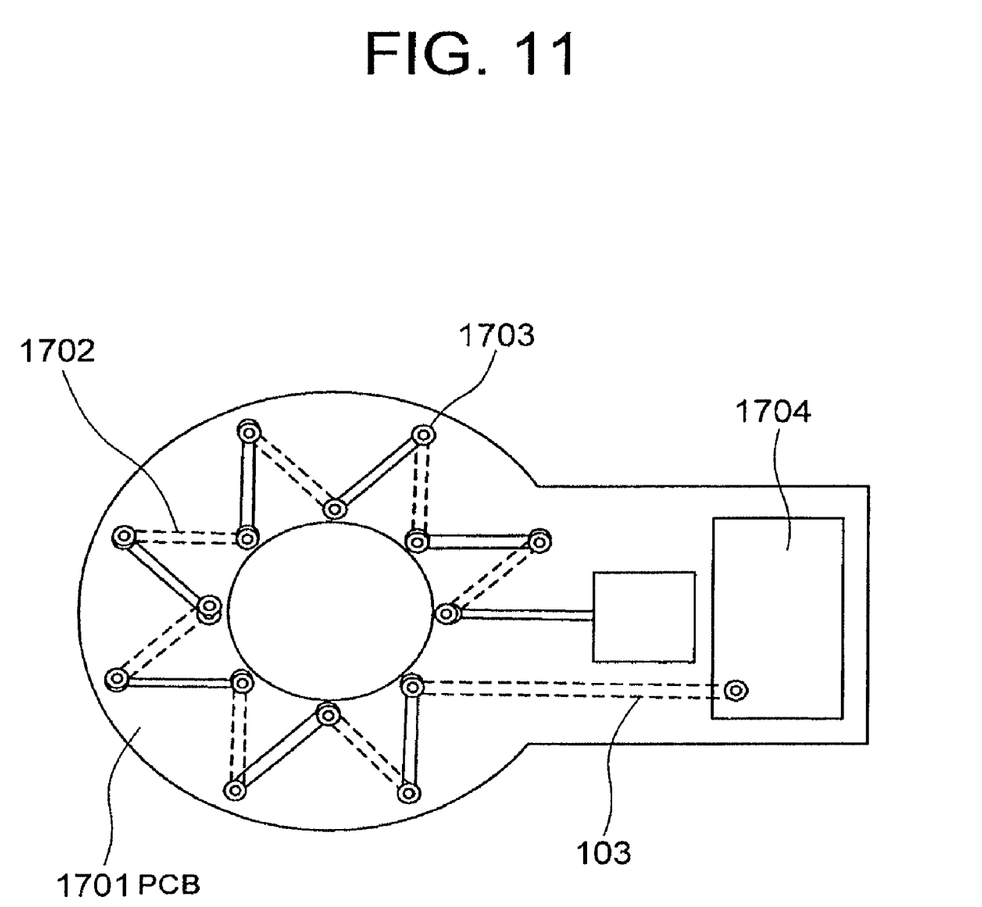
FIG. 11 is a plan view showing a structure of a fifth embodiment of the current probe according to the invention.

Referring now to FIG. 11, a fifth embodiment of the junction-current probe 203 will be described.

The present embodiment differs from the first embodiment of junction port probe in that insulator 101, coiled conductor wire 102, extraction lead 103 and conductor member 1401, shown in FIG. 14 described later, are all set up in the form of a printed circuit board (PCB) 1701. In this case, the coiled conductor wire 102 can be formed, in a pseudo-fashion, of a wiring pattern 1702 and through-holes 1703, having an advantage of facilitating collective formation and thickness reduction. Further, when the PCB has a multi-layer structure, conductor members can be provided on the upper and lower layers and on the inner wall surface of central hole as in the case of the second embodiment of junction-current probe, thereby finding an application to measurement in the case where the junction member is made of an insulating material. Besides, in the present structure, a ceramic board, for example, may substitute for the PCB1701 with a view to reducing a loss in high frequency characteristics.

The fifth embodiment has an application to an instance where the insulator 101, coiled conductor wire 102, extraction lead 103 and conductor member 1401 are all materialized in the form of a semiconductor board of silicon or a pattern of copper in order that the resistance element, capacitive element and diode can be integrated to thereby reduce the size of the current probe 203. To add, the current probe can be surrounded with a dielectic material to promote the strength.

Figure 12:
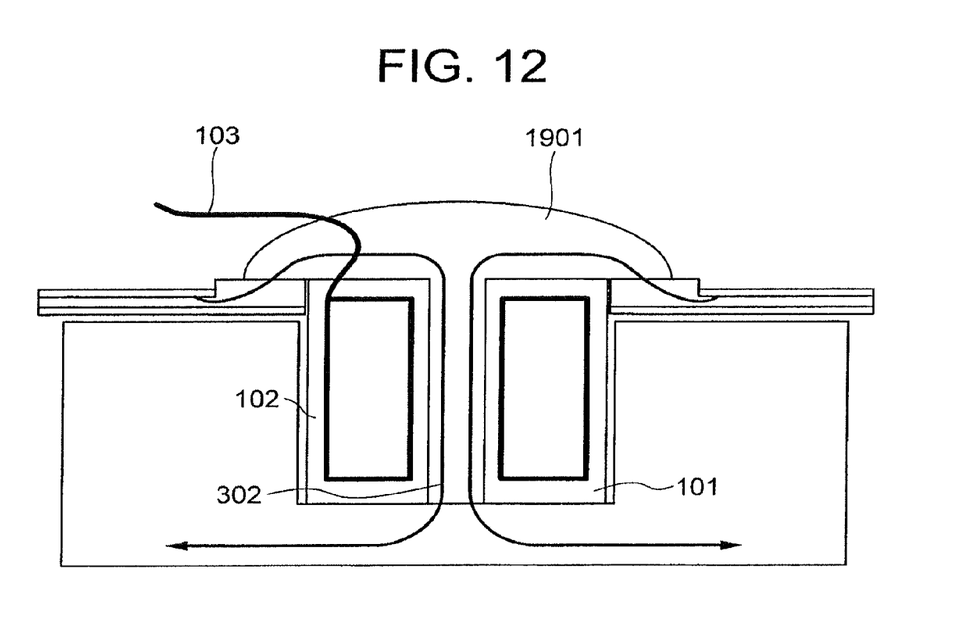
FIG. 12 is a fragmentary sectional view showing a structure of a sixth embodiment of the current probe according to the invention.

Reference is now made to FIG. 12 to describe a sixth embodiment of junction-current probe 203.

It is presupposed in the foregoing embodiments that the junction port or junction member is passed through the central hole of current probe 203 but as shown in FIG. 12, a coiled conductor wire 102 may be formed in a junction port or junction member 1901 and an extraction lead 103 may be so laid as to go out of the junction member. Advantageously, with this structure, a junction-current 302 can be measured under the condition that the packaging state can approximate practical one more closely. In this case, however, the coiled conductor wire 102 formed in the junction member 1901 must be insulated electrically from the junction member by means of an insulator 101.

In the foregoing embodiments of the present invention, the method of connecting the extraction lead 103 to the current probe 203 and cable 104 is not particularly limited and connection based on lead free soldering and a detachable type connection structure using a small-size connector may be employed. This can facilitate packaging in case the junction-current probe 203 is built in. Further, in the foregoing embodiments, the coiled conductor wire 102 is supposed to detect the magnetic field 303 but instead of the coiled conductor wire 102, a device for detection of magnetic field 303, such as for example, a Hall device may be used. And also, when the junction member is an electrically conductive member, the current probe in any embodiment is preferably covered with an insulating film so as to be prevented from electrically contacting the electrically conductive junction member.

Figure 15:
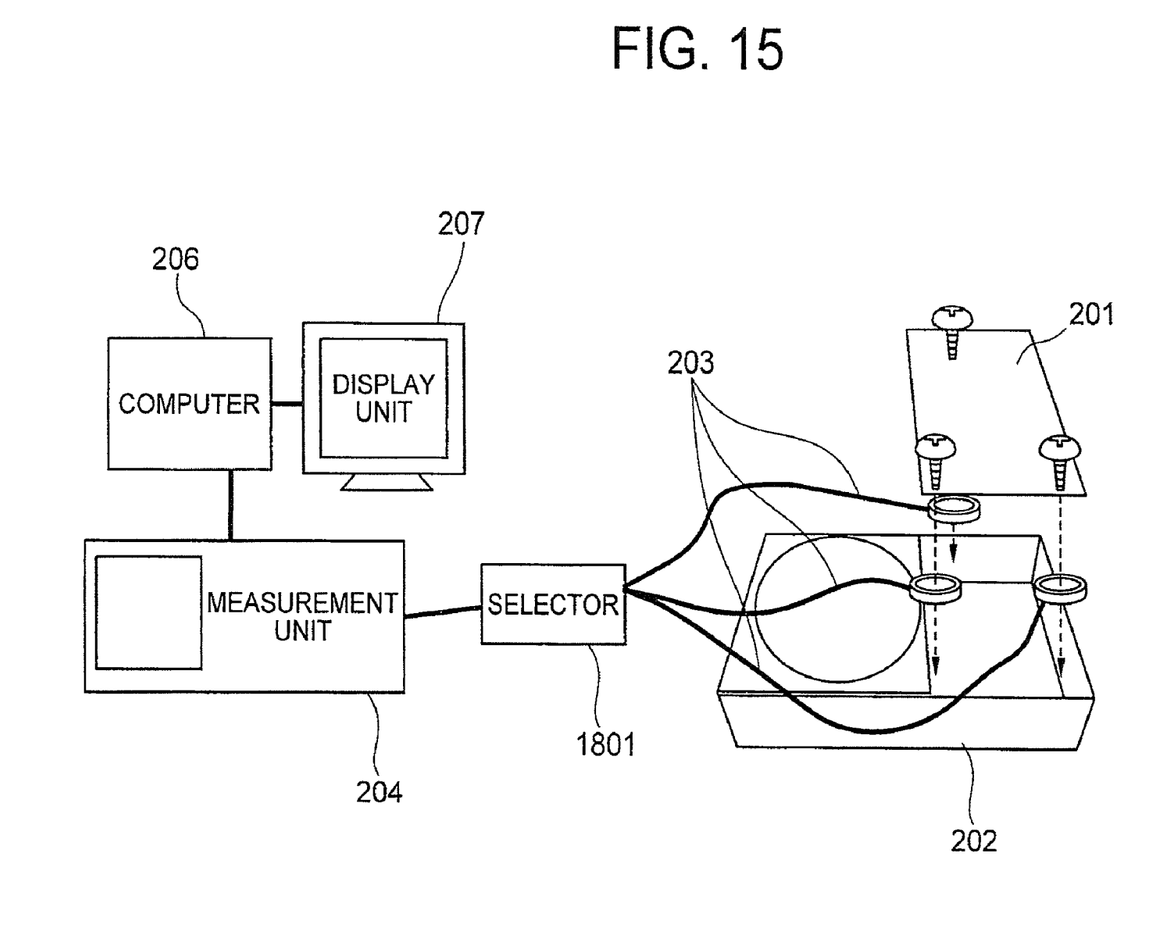
FIG. 15 is a diagram showing another example of configuration of the measurement apparatus according to the invention.

Referring now to FIG. 15, another embodiment of the measurement apparatus using the current probe will be described.

In the measurement apparatus of FIG. 2 as described previously, it is assumed that a single current probe 203 is connected to a single measurement unit 204 but structurally, a plurality of members of current probe 203 are prepared as shown in FIG. 15 and measurement is conducted while switching over junction-currents 302 at the plural sites by means of a selector 1801, for instance. Generally, a plurality of junction ports are employed for mounting the circuit board 201 to the chassis 202 and in case reassembling is to be carried out each time that measurement of each junction-current 302 is completed, there arises a problem that the number of measurement steps increases in proportion to the number of junction ports. Under the circumstances, the structure having the plural junction-current probes 203 incorporated is packaged to the chassis and measurement is carried out by switching over the selector 1801 to drastically reduce the measurement time. In this case, a plurality of identical types of junction-current probes or a combination of a plurality of different types of junction-current probes in the foregoing embodiments may be used.

The measurement apparatus of the present invention has been described by way of a typical example of the measurement targeted to the packaged board and chassis but this is not limitative and the measurement may be applied to a junction port for the case in which an electronic apparatus mounted with the board is packaged to the chassis.

Typical embodiments in view of the foregoing disclosure of the embodiments are as follows.

(1) A junction-current probe for measuring a current in a port adapted to connect a chassis of an electronic apparatus and a PCB (Printed Circuit Board) or a module of the electronic apparatus, wherein a current in the junction port can be measured under such a practical operation condition that connection of individual components to the chassis has been completed.

(2) A junction-current probe as recited in (1), wherein a current in a circular conductor member having a hole in the center or in a junction port is measured.

(3) A junction-current probe as recited in (1) or (2), wherein the thickness of the probe is made to be small amounting to 1 cm or less so as to keep the distance between a circuit board and an electronic apparatus or between electronic apparatuses unchanged in packaged condition.

(4) A junction-current probe as recited in any of (1) to (3), wherein the insulator, conductor and electronic parts are materialized in the form of a PCB or a pattern thereof.

(5) A junction-current probe as recited in (1) to (4) for use in a measurement apparatus, wherein either electronic parts such as resistor, capacitor, inductor or diode or an electric member having a comparable function is provided on the probe or a midway connection between the probe and a measurement unit.

(6) A junction-current probe as recited in any of (1) to (5) for use in a measurement apparatus, wherein a plurality of probe members are provided and junction-currents at a plurality of sites are measurable at a time or they are switched over by means of a selector to permit each junction-current to be measured.

(7) A junction-current probe as recited in any of (1) to (6) for use in a measurement apparatus, wherein the insulator, the conductor wire and electronic parts are materialized in the form of copper or silicone formed through a semiconductor process.

(8) A junction-current probe as recited in any of (1) to (7), wherein a conductor wire wound in a coil on a circular or rectangular insulator having a hole in the center is surrounded with an insulating member.

(9) A junction-current probe as recited in any of (1) to (8), wherein a conductor wire is wound in a coil on a circular or rectangular insulator having a hole in the center and conductor members are provided at circumferential edge zones on upper and lower surfaces of the insulator, respectively, and a conductor member is provided on an inner wall of the central hole.

(10) A junction-current probe as recited in any of (1) to (9), wherein a rectangular insulator having a hole in the center is made of a magnetic material or has it internally thereof.

(11) A junction-current probe as recited in any of (1) to (10), wherein the conductor wire is wound in a coil on a circular or rectangular insulator having a hole in the center is surrounded with a conductor member.

(12) A junction-current probe as recited in any of (1) to (11), wherein the coiled conductor wire is formed in the junction port or junction member and an extraction lead is led out of the junction member.

(13) A junction-current probe as recited in any of (1) to (12), wherein an extraction lead for connecting the coiled conductor wire and the cable is provided in the junction port or junction member or a dismountable connector is provided on the probe.

(14) A junction-current probe as recited in any of (1) to (13), wherein a cable and an extraction lead are provided which are used for connection to a magnetic field detection device such as Hall device and to the measurement unit.

According to the present invention, a measurement method of speedily performing an EMI counterplot for a chassis connected with a circuit board or an electronic apparatus mounted with a circuit board can be provided. Further, according to the invention, a probe for realizing the measurement method can be provided.

The invention may be embodied in order specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range or equivalency of the claims are therefore intended to be embraced therein.

The invention claimed is:

1. A current probe for measuring a current in a junction member adapted to connect a chassis and a board, comprising:
   a circular insulator having a hole configured to receive the junction member; and
   a conductor wire wound on said insulator in a coil by a plurality of turns,
   wherein the junction member is inserted through the hole in the circular insulator in order to connect the chassis and the board.

2. A current probe according to claim 1, wherein a conductor member is provided at a circumferential edge zone of the hole on one surface of said insulator, a congruent conductor member is provided at a circumferential edge zone on the other surface of said insulator and said conductor members are electrically connected together by way of a conductor member provided on an inner wall of the hole of said insulator.

3. A current probe for measuring a current in a junction member adapted to connect a chassis and a board, comprising:
   an insulator having a hole configured to receive the junction member;
   a conductor wire wound in a coil on said insulator; and
   an insulating film so formed as to cover part of said conductor wire which confronts at least an inner wall of said hole,
   wherein the junction member is inserted through the hole in the circular insulator in order to connect the chassis and the board.

4. A current probe for measuring a current in junction members adapted to connect a chassis and a board comprising:
   a plurality of circular insulators each having a hole configured to receive a respective junction member,
   a plurality of conductor wires wound on each of the insulators in a coil by a plurality of turns, and
   a selector connected to each of the plurality of conductor for selecting one of the plurality of conductors by which a current is measured,
   wherein the junction members are inserted through the respective holes in the plurality of circular insulators in order to connect the chassis and the board.

* * * * *